(12) United States Patent
Dell et al.

(10) Patent No.: US 10,088,498 B2
(45) Date of Patent: Oct. 2, 2018

(54) STIMULATING AN OPTICAL SENSOR USING OPTICAL RADIATION PRESSURE

(71) Applicant: Panorama Synergy Ltd, Sydney (AU)

(72) Inventors: John Dell, Sydney (AU); Lorenzo Faraone, Sydney (AU); Roger Jeffery, Sydney (AU); Adrian Keating, Sydney (AU); Mariusz Martyniuk, Sydney (AU); Gino Putrino, Sydney (AU); Dilusha Silva, Sydney (AU)

(73) Assignee: Panorama Synergy Ltd, Sydney, New South Wales (AU)

( * ) Notice: Subject to any disclaimer, the term of this patent is extended or adjusted under 35 U.S.C. 154(b) by 68 days.

(21) Appl. No.: 15/443,339

(22) PCT Filed: Aug. 28, 2015

(86) PCT No.: PCT/AU2015/050505
§ 371 (c)(1),
(2) Date: Feb. 27, 2017

(87) PCT Pub. No.: WO2016/029273
PCT Pub. Date: Mar. 3, 2016

(65) Prior Publication Data
US 2017/0261531 A1    Sep. 14, 2017

(30) Foreign Application Priority Data
Aug. 29, 2014  (AU) ................. 2014903439
Aug. 29, 2014  (AU) ................. 2014903446

(51) Int. Cl.
*G01Q 60/38*    (2010.01)
*G01Q 70/16*    (2010.01)
*G01Q 10/00*    (2010.01)

(52) U.S. Cl.
CPC ............. *G01Q 10/00* (2013.01); *G01Q 60/38* (2013.01)

(58) Field of Classification Search
CPC ........ G01Q 10/00; G01Q 60/38; G01Q 70/02; G01Q 70/08; G01B 9/02034; G01N 27/7746; G01N 29/22; G01N 29/022
(Continued)

(56) References Cited

U.S. PATENT DOCUMENTS 8,116,624 B1 * 2/2012  Wach ................. G01M 11/35
                                                    398/20
8,600,200 B1   12/2013  Rakich et al.
(Continued)

OTHER PUBLICATIONS

Tallur et al., "A Silicon Nitride Optomechanical Oscillator with Zero Flicker Noise", Feb. 2012, MEMS 2012, pp. 19-22.*
(Continued)

*Primary Examiner* — Nicole Ippolito
(74) *Attorney, Agent, or Firm* — Clark Hill PLC; John S. Paniaguas

(57) ABSTRACT

A method of stimulating a MicroElectroMechanical Systems (MEMS) structure (e.g. a cantilever), and an optical sensor for use in such a method, using optical radiation pressure instead of electrostatic pressure, or the like. An optical pulse creates optical radiation pressure which stimulates movement of the MEMS structure and then movement of the MEMS structure may be measures. An interrogating light may be input after the optical pulse to measure movement of the MEMS structure. Advantageously, the same light source can be utilized to stimulate movement of the MEMS structure and to measure movement of the MEMS structure.

22 Claims, 4 Drawing Sheets

(58) Field of Classification Search
USPC .......................................................... 250/251
See application file for complete search history.

(56) References Cited

U.S. PATENT DOCUMENTS

| | | | |
|---|---|---|---|
| 2007/0089496 A1 | 4/2007 | Degertekin | |
| 2007/0107501 A1 | 5/2007 | Taber | |
| 2012/0218559 A1 | 8/2012 | Dell et al. | |
| 2013/0205455 A1 | 8/2013 | Dell et al. | |
| 2014/0139843 A1 | 5/2014 | Dell et al. | |
| 2014/0163392 A1* | 6/2014 | Flanders | A61B 5/6852 600/480 |
| 2014/0368829 A1* | 12/2014 | Dell | G01N 21/7746 356/480 |

OTHER PUBLICATIONS

Tallur S., et al.: "A silicon nitride optomechanical oscillator with zero fliker noise", MEMS 2012, Paris, France, Jan. 29-Feb. 2, 2012, pp. 19-22, INSPEC Accession No. 12617931, DOI: 10.1109/ MEMSYS. 2012.6170083.

Pham, S. V. et. al.: "Grated Waveguide Cavity for Label-free Protein and Mechano-Optical Gas Sensing", IQEC/ CLEO Pacific Rim 2011, Aug. 28-Sep. 1, 2011, pp. 89-91.

Putrino, G. et. al.: "Comparison of dynamic and static operation of a novel optical read-out technology for micromachined cantilever sensors", Conference on: Optoelectronic and Microelectronic Materials and Devices (COMMAD), 2010, IEEE, pp. 21-22.

G. Roelkens et al: "Grating-Based Optical Fiber Interfaces for Silicon-on-Insulator Photonic Integrated Circuits", IEEE Journal of Selected Topics in Quantum Electronics, vol. 17, No. 3, May/Jun. 2011.

L.J. Kauppinen et al: "Grated Waveguide Optical Cavity as a Compact Sensor for Sub-nanometre Cantilever Deflections", MESA Research Institute for Nanotechnology, University of Twente, The Netherlands.

Lee Carroll et al: "Optimizing polarization-diversity couplers for Si-photonics: reaching the -1dB coupling efficiency threshold", Department of Physics, University of Pavia, Italy, Optics Express, vol. 22, No. 12, 2014.

Lasse Kauppinen: "Compact integrated optical devices for optical sensor and switching applications", Wohrmann Print Service ISBN: 978-90-365-3088-0, The Netherlands, 2010.

Jose Vicente Galán: "Addressing Fiber-to-Chip Coupling Issues in Silicon Photonics"; Valencia, Dec. 2010.

* cited by examiner

210 Inputting an optical pulse into an interrogating grating coupler, the interrogating grating coupler being arranged to form a resonant cavity with a cantilever; wherein the optical pulse creates optical radiation pressure within the cavity and the optical radiation pressure stimulates a movement of the cantilever.

Section A-A of FIG. 4

Section B-B of FIG. 4

STIMULATING AN OPTICAL SENSOR USING OPTICAL RADIATION PRESSURE

FIELD OF THE INVENTION

The present invention relates to an optical sensor and a method of stimulating a cantilever, a beam, a membrane or any other suitable MicroElectroMechanical Systems (MEMS) structure.

BACKGROUND OF THE INVENTION

MicroElectroMechanical Systems (MEMS)-based microstructures, and more specifically micro-cantilever sensors, are commonly used in applications such as Atomic Force Microscopy and analyte detection, by measuring a deflection of a micro-cantilever using free space optics.

There are two common modes of operation of micro-cantilever sensors, namely a static mode and a dynamic mode of operation. In the static mode, the micro-cantilever flexes, for example, as a force is applied to it or upon the adsorption of an analyte, and an amount of movement is measured.

In the dynamic mode the micro-cantilever oscillates at or near its resonant frequency. When an analyte is adsorbed, for example, the oscillation frequency of the cantilever changes which may be measured in order to determine the presence of an analyte.

When used in Atomic Force Microscopes (AFM), an oscillating tip of the AFM is scanned at a height where it barely touches or "taps" a sample surface. An analyser monitors the sensor position and a vibrational amplitude to obtain topographical and other property information, allowing topographical information to be obtained even for fragile surfaces. One method of stimulating the micro-cantilever to oscillate is to apply an electrostatic charge to pads located on a substrate under the cantilever. Other methods of stimulating the micro-cantilever to oscillate employ piezoelectric stimulation. However these methods result in a complex sensor, and require additional equipment to generate the electrostatic or piezoelectric charge. There is therefore a need for an improved optical sensor.

The reference to any prior art in this specification is not, and should not be taken as, an acknowledgement or any form of suggestion that the prior art forms part of the common general knowledge.

OBJECT OF THE INVENTION

It is an object of some embodiments of the present invention to provide consumers with improvements and advantages over the above described prior art, and/or overcome and alleviate one or more of the above described disadvantages of the prior art, and/or provide a useful commercial choice.

SUMMARY OF THE INVENTION

In one form, although not necessarily the only or the broadest form, the invention resides in a method of stimulating a MicroElectroMechanical Systems (MEMS) structure, the method including the steps of:

inputting an optical pulse into an interrogating grating coupler, the interrogating grating coupler being arranged to form a resonant cavity with the MEMS structure; wherein the optical pulse creates optical radiation pressure within the cavity and the optical radiation pressure stimulates a movement of the MEMS structure.

Preferably the step of stimulating a movement of the MEMS structure with the optical radiation pressure includes stimulating a movement of the MEMS structure primarily with the optical radiation pressure.

Preferably, the method further includes the step of inputting an interrogating light into the interrogating grating coupler after the optical pulse for measuring a deflection of the MEMS structure.

Preferably the method further includes the step of resonating the interrogating light in the optical cavity between the MEMS structure and the interrogating grating coupler. Preferably the method further includes the step of outputting and analysing the interrogating light. Preferably the method further includes the step of adjusting an amplitude of a light source to produce both the interrogating light and the optical pulse.

Preferably, the method further includes the step of measuring static or dynamic nanometer and subnanometer movements in air, vacuum, or liquids.

Preferably, the MEMS structure has an analyte selective coating applied to all or part of its surface. Preferably the method further includes the step of changing the mass of the MEMS structure by adsorbing analytes.

Preferably, the MEMS structure is a cantilever, beam, or membrane.

Preferably, the method further includes the step of resonating the optical pulse within the resonant cavity and increasing a finesse of the optical cavity such that the optical radiation pressure increases and a greater force acts on the MEMS structure to move the MEMS structure.

In another form, the invention resides in an optical sensor including:

a MEMS structure; and
an interrogating grating coupler positioned under the MEMS structure; wherein
the MEMS structure and the interrogating grating coupler form a resonant cavity; and
an optical pulse input to the interrogating grating coupler creates an optical radiation pressure and the optical radiation pressure stimulates a movement of the MEMS structure.

Preferably, the MEMS structure is a MEMS-based cantilever. Alternatively, the MEMS structure may be a beam or membrane. Preferably, the MEMS structure includes an analyte selective coating. Preferably, the interrogating grating coupler is one dimensional. Preferably, the interrogating grating coupler is two dimensional. Preferably, the interrogating grating coupler includes an array of holes.

Preferably, the array is a regular shape. Preferably, the array forms a square. Preferably, the array forms a rectangle. Preferably, the array is an irregular shape. Preferably, the holes are etched in a Silicon on Insulator (SOI) layer. Preferably, each hole is cylindrical in shape.

Preferably, the SOI layer is formed on a Buried Oxide (BOX) layer. Preferably, the BOX layer is formed on a substrate. In an alternate embodiment, the SOI layer is formed on the substrate. Preferably, a Top Oxide (TOX) layer is formed on the SOI layer.

Preferably, the optical sensor includes an input grating coupler for inputting the optical pulse into the optical sensor. Preferably, the input grating coupler is one dimensional. Preferably, the input grating coupler is two dimensional.

Preferably, the optical sensor includes an output grating coupler for outputting the optical pulse from the optical sensor. Preferably, the output grating coupler is one dimensional. Preferably, the output grating coupler is two dimensional.

BRIEF DESCRIPTION OF THE DRAWINGS

To assist in understanding the invention and to enable a person skilled in the art to put the invention into practical effect, preferred embodiments of the invention will be described by way of example only with reference to the accompanying drawings, in which.

DETAILED DESCRIPTION

Figures 1, 2:
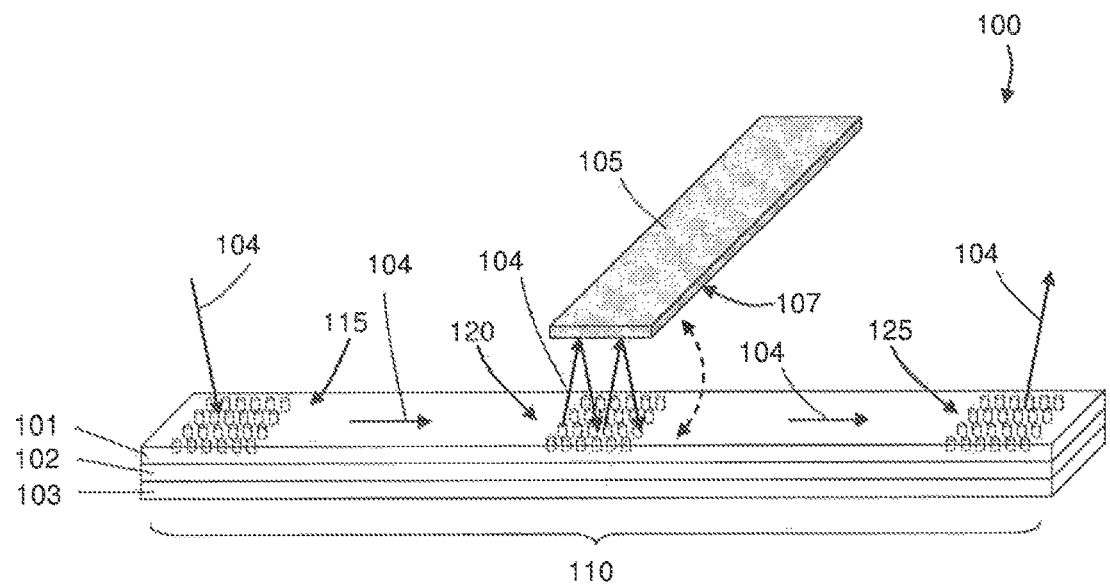
FIG. 1 shows a perspective view of an optical sensor according to an embodiment of the present invention.
FIG. 2 shows a flow diagram of a method of stimulating a movement of a MEMS structure according to an embodiment of the present invention.

Elements of the invention are illustrated in concise outline form in the drawings, showing only those specific details that are necessary to understanding the embodiments of the present invention, but so as not to clutter the disclosure with excessive detail that will be obvious to those of ordinary skill in the art in light of the present description.

In this patent specification, adjectives such as first and second, left and right, front and back, top and bottom, etc., are used solely to define one element from another element without necessarily requiring a specific relative position or sequence that is described by the adjectives. Words such as "includes" or "includes" are not used to define an exclusive set of elements or method steps. Rather, such words merely define a minimum set of elements or method steps included in a particular embodiment of the present invention. It will be appreciated that the invention may be implemented in a variety of ways, and that this description is given by way of example only.

FIG. 1 shows a perspective view of an optical sensor 100 according to an embodiment of the present invention. The optical sensor 100 includes a MEMS structure in the form of a grating coupled resonating structure 110. The grating coupled resonating structure 110 includes an input grating coupler 115, an interrogating grating coupler 120 and an output grating coupler 125. The interrogating grating coupler 120 is placed directly under and adjacent to the cantilever 105 such that the interrogating grating coupler 120 and the cantilever 105 form a resonant cavity therebetween.

In order to form a resonant cavity, the cantilever 105 must be positioned sufficiently close to the interrogating grating coupler 120 for a wavelength of operation of light input to the optical sensor 100. Generally, the distance between the cantilever 105 and the interrogating grating coupler 120 is between less than a wavelength of the wavelength of operation to a number of wavelengths of the wavelength of operation. As would be known to a person skilled in the art an amplitude of light output (or a response) from the resonant cavity varies cylically through constructive and destructive interference as the separation changes through integer numbers of quarter wavelengths (for a round trip path length in half wavelengths). In one example, for an optical wavelength of 1550 nm, the separation may be from less than a micron (μm) up to 30 microns (μm).

FIG. 2 shows a flow diagram 200 of a method of stimulating a MEMS structure in such as a cantilever 105. At step 210, an optical pulse is input into the interrogating grating coupler 120, wherein the interrogating grating coupler 120 forms a resonant cavity with the cantilever 105. The optical pulse creates optical radiation pressure within the cavity which stimulates a movement of the cantilever 105.

An advantage of the method of the present invention is that a same light source may be used to generate the optical pulse to stimulate the MEMS structure, and to measure a deflection of the MEMS structure. As a result, a more compact sensor can be fabricated which does not require additional apparatus to stimulate movement of the MEMS structure.

As shown in FIG. 1, the optical pulse is input via the input grating coupler 115, as shown by solid arrows 104. The optical pulse propagates along the grating coupled resonating structure 110 to the interrogating grating coupler 120 where it exits the grating coupled resonating structure 110, and resonates with the cantilever 105. As a result, optical radiation pressure is created which stimulates a movement or an oscillation of the cantilever 105. In some embodiments, the optical pulse resonates within the cavity which increases a finesse of the optical cavity and results in an increased optical pressure and hence a greater force acting on the cantilever 105 to move the cantilever 105.

Figure 3:
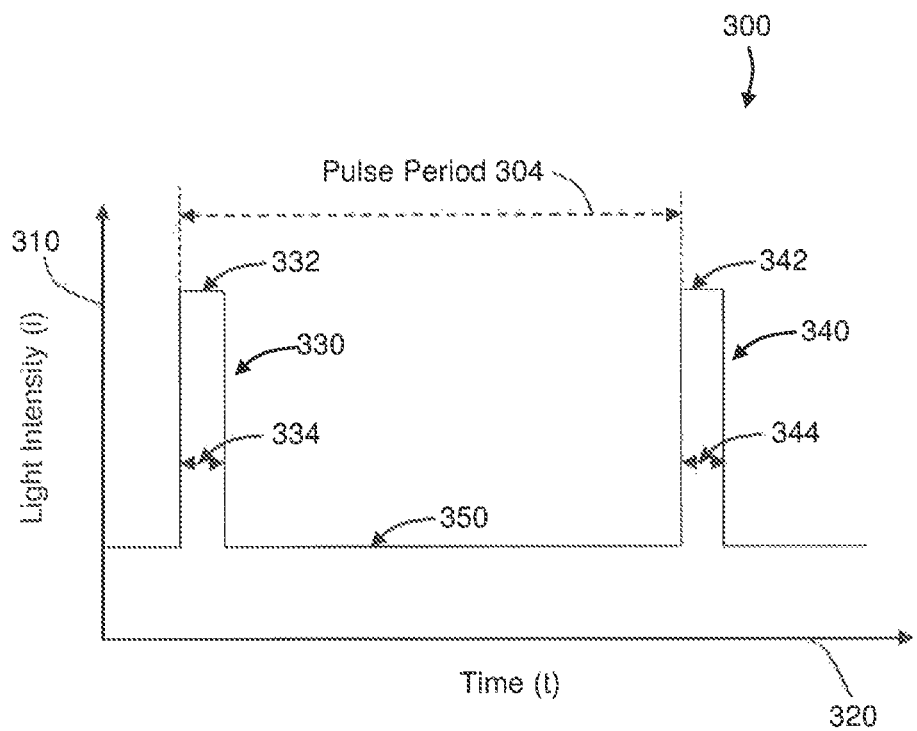
FIG. 3 shows a graph of exemplary optical pulses according to an embodiment of the present invention.

FIG. 3 shows a graph 300 of exemplary optical pulses 330, 340 according to an embodiment of the present invention. The graph 300 shows an amplitude of light intensity axis 310 of light output from the sensor 100 against a time axis 320, representing of a first optical pulse 330 and a second optical pulse 340. The first optical pulse 330 has a first amplitude 332 and a first pulse width 334. Similarly, the second optical pulse 340 has a second amplitude 342 and a second pulse width 344. A time between the first optical pulse 330 and the second optical pulse 340 is pulse period 304. Although FIG. 3 shows two optical pulses 330, 340, it should be appreciated that any number of optical pulses may be used to stimulate movement of the cantilever 105.

Although FIG. 3 shows that the first optical pulse 330 and the second optical pulse 340 have a same amplitude 332, 342 and a same pulse width 334, 344, it should be appreciated that the pulses 330, 340 may have different amplitudes 332, 342 and different pulse widths 334, 344. Furthermore, the pulse period 304 may be the same between successive pulses or different between successive pulses.

An amount of movement of the cantilever 105 may be controlled by varying the amplitude 332, 342 and/or the pulse width 334, 344. Generally, a higher amplitude causes a greater movement for a same pulse width. Similarly, a wider pulse width 334, 344 causes a greater movement for a same amplitude up to a pulse width 334, 344 of less than half a period of resonant frequency of the cantilever 105. It should be appreciated that as the pulse width 334, 344 goes beyond half a period, a response of the cantilever 105 decreases and reaches a minimum at a full period. Further increases in pulse width will cause the response to increase after a full period to a maximum at one and a half periods and decreasing to a minimum at two periods, a process which is repeated for subsequent periods. In addition, there are practical limits due to power density considerations in the grating coupled resonating structure 110, and unwanted heating effects on the cantilever 105.

In one embodiment, at infra-red wavelengths, a light source with a pulse width of between 5 µs and 50 µs and an amplitude of 4.4 mW to 5.6 mW (assuming a 3 dB loss coupling the light via the input grating coupler 115) produces an optical pulse emitted from the interrogating grating coupler 120 with an estimated power of 2.2 mW to 2.8 mW. However it should be appreciated that the pulse width may be between 100 ns and 100 µs or more, depending on the resonant frequency of the cantilever 105.

Once the optical pulse 330, 340 stimulates a movement in the cantilever 105, an interrogating light 350 with a lower amplitude than the optical pulse 330, 340 may be input to the sensor 100 directly after the optical pulse, in order to measure a movement of the cantilever 105. The interrogating light 350 resonates in the optical cavity between the cantilever 105 and the interrogating grating coupler 120. The interrogating light 350 output from the interrogating grating coupler 120 may be analysed by an analyser (not shown) connected to the output grating coupler 125. For example, a frequency of the amplitude modulation of the interrogating light 350 output from the interrogating grating coupler 120 may be analysed. Although the optical pulse and the interrogating light are described as being separate, it should be appreciated that an amplitude of a same light source may be adjusted to produce the interrogating light 350 and the optical pulse 330, 340.

In some embodiments, the heating effects previously described may be used to change the temperature of the cantilever 105 or a beam by changing the pulse period 304 and/or the pulse width 334, 344 of the optical pulses 330, 340. For example a shorter pulse period 304 or a greater pulse width 334, 344 will increase the temperature of the cantilever 105 or beam more (due to an increase in energy incident on the cantilever 105). In addition, an amplitude of the interrogating light 350 used to sense the cantilever's position can also be varied in order to vary the temperature of the cantilever 105.

Figure 4:
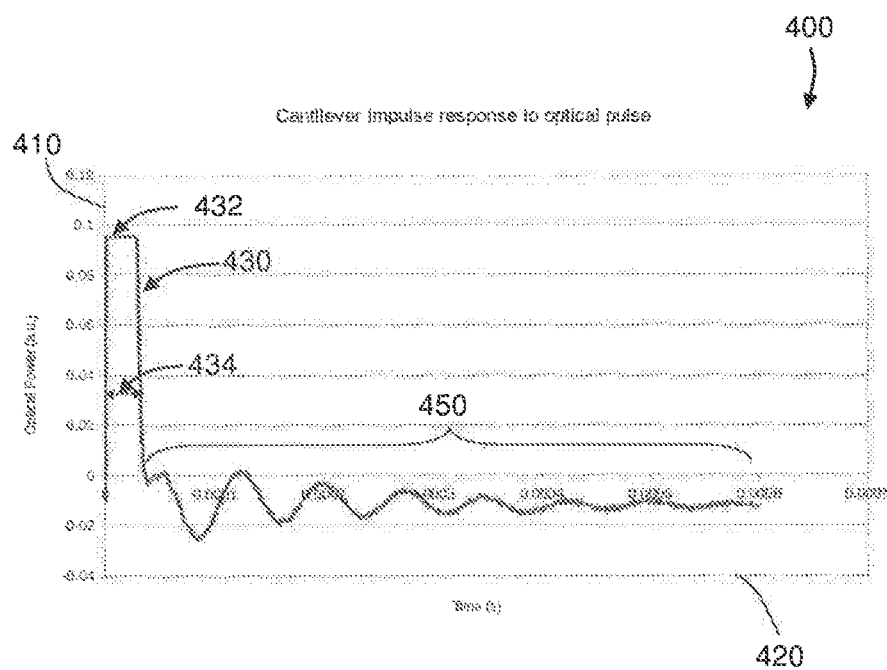
FIG. 4 shows a graph of a response to an optical pulse according to an embodiment of the present invention.

FIG. 4 shows a graph 400 of a response to an optical pulse according to an embodiment of the present invention. The graph 400 shows an amplitude of light axis 410 of light output from the sensor 100 versus a time axis 420 representing an optical pulse 430 and an interrogating light 450. As shown in FIG. 4, the optical pulse 430 has a pulse amplitude 432 and a pulse width 434 and stimulates a movement of the cantilever 105 such that the cantilever 105 oscillates in a dynamic mode of operation. Directly after the optical pulse 430 an interrogating light 450 is input to the input grating coupler 115, and the interrogating light 450 is modulated as the cantilever 105 oscillates towards, and away from the interrogating grating coupler 120 which is analysed by the analyser. However, it should be appreciated that the interrogating light 450 may be input at a time after the optical pulse 430. However the interrogating light 450 should be input before the cantilever 105 stops oscillating.

Optical power of the optical pulse 430 in the cavity exerts radiation force F on the cantilever given by:

$$F = 2P \mathcal{F} (\cos(\alpha)^2/c,$$

where:
P is the optical power,
the factor 2 accounts for ideal reflection from the cantilever,
$\mathcal{F}$ is the finesse of the optical cavity,
c is the velocity of light, and
α is the angle of incidence of the light to and from the grating coupler.

The displacement z of a MEMS structure due to this force is given by:

$$z = F/k,$$

where:
k is the structure's spring constant (N/m).

For MEMS structures that can be modelled as second order systems such as a cantilever 105, the displacement z(t) in response to a step is given by:

$$z(t) = \{(1 - e^{-\xi\omega_n t})/(1-\xi^2)^{1/2}\} \sin(\omega_d t - \arcsin((1-\xi^2)^{1/2})$$

where:

$$\omega_d = \omega_n/(1-\xi^2)^{1/2}$$

When the optical radiation pressure is in the form of a sufficiently short optical pulse 430, a response of the cantilever is given by a finite impulse response, readily found by adding a unit step response at time t, u(t) to the negative unit step response delayed by τ, u(t−τ), where τ defines the width of the optical pulse. Thus a response of the cantilever 105 to the pulse 430 is a finite impulse response of the cantilever 105 and is defined by the following equation:

$$z(t) = \frac{F_o}{k}\left(1 - \frac{e^{-\zeta\omega_n t}}{\sqrt{1-\zeta^2}}\sin(\omega_n t\sqrt{1-\zeta^2} + \phi)\right)u(t) -$$

$$\frac{F_o}{k}\left(1 - \frac{e^{-\zeta\omega_n(t-\tau)}}{\sqrt{1-\zeta^2}}\sin(\omega_n(t-\tau)\sqrt{1-\zeta^2} + \phi)\right)u(t-\tau)$$

$$\phi = \arcsin(\sqrt{1-\zeta^2})$$

Where: z(t) is the cantilever displacement as a function of time,
$\omega_n$ is the natural frequency of the cantilever,
ξ is the damping ratio,
k is the spring constant of the cantilever,
$F_0$ is the force due the radiation pressure,
τ is the optical pulse width, and
u(t) is the unit step function.

In some embodiments, a wavelength of the optical pulse 430 may be different to a wavelength of the interrogating light 450 so that a movement of the cantilever can be detected using the interrogating light 450 during application of the optical pulse 430. In this embodiment, a wavelength division demultiplexer, connected to the output grating coupler 125, may be used to separate the optical pulse 430 from the interrogating light 450.

In a further embodiment, the optical pulse 430 may be input via the output grating coupler 125 i.e. propagating in a direction opposite to the interrogating light since light travelling in different directions does not interact (if the SOI layer 101 is not exhibiting non-linear behaviour). The wavelength of the optical pulse 430 is preferably close to a design wavelength of the interrogating grating coupler 120, otherwise the efficiency of the optical radiation pressure will decrease.

Referring back to FIG. 1, in some embodiments, a bottom surface of the cantilever 105 includes a reflective surface 107, where the reflective surface 107 is opposite a top surface of the interrogating grating coupler 120.

In the embodiment of FIG. 4, an SOI layer 101 of 220 nm was used to define an optical waveguide which operates in a single mode for wavelengths between 1470 nm and 1610 nm. In addition, in some embodiments, dimensions of the cantilever 105 may be 220 µm×20 µm×0.75 µm, and a static distance between the cantilever 105 above the interrogating grating coupler 120 may be approximately 12 μm at a standard temperature and pressure. A resonant frequency of the cantilever 105 may be found from a response to a step force applied by an electrostatic actuation of 13.4 kHz, and a damping ratio, dominated by squeeze film damping, of 0.07, may also be determined from the electrostatic step response.

In the embodiment of FIG. 4, a single mode laser at 1550 nm may be used to generate both the impulses and light need to monitor the cantilever's 105 position. The laser may be temperature stabilized and an optical rear cavity light may be used to stabilize the laser's light output to approximately 10 mW. A pulse driver may be used to apply short current impulses to an otherwise constant laser current, which increases a laser output to approximately 60 mW during the optical pulses 430, and these current pulses are filtered from a laser stabilization circuit. A repetition rate of the laser pulses is set to be sufficient long for the cantilever impulse response to settle at 1 ms. In this embodiment, an estimated constant light power in the SOI layer 101 is approximately 0.5 mW and a peak optical power in the optical cavity is approximately 3 mW.

In one embodiment 3 mW, 20 usec optical pulses 430 at 1550 nm, coupled from a silicon slab waveguide via a grating coupler to a cantilever 105 suspended 6 μm above, displaces the cantilever approximately 14 nm.

Figure 9:
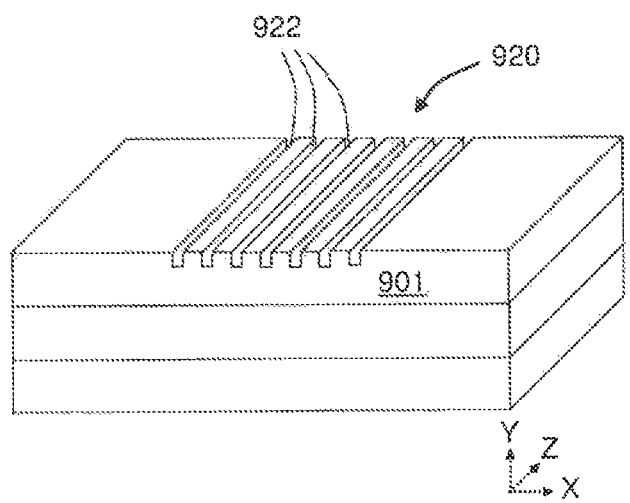
FIG. 9 shows a top perspective view of a one-dimensional interrogating grating coupler according to an embodiment of the present invention.

In some embodiments, each of the input grating coupler 115, the interrogating grating coupler 120 and the output grating coupler 125 are formed from an array of holes 122 forming a two-dimensional (2D) grating coupler. However, it should be appreciated that the input grating coupler 115, and the output grating coupler 125 may be a one dimensional (1D) grating coupler 920 as shown in FIG. 9 which includes a series of grooves 922 formed or etched in an SOI layer 901.

Figure 5:
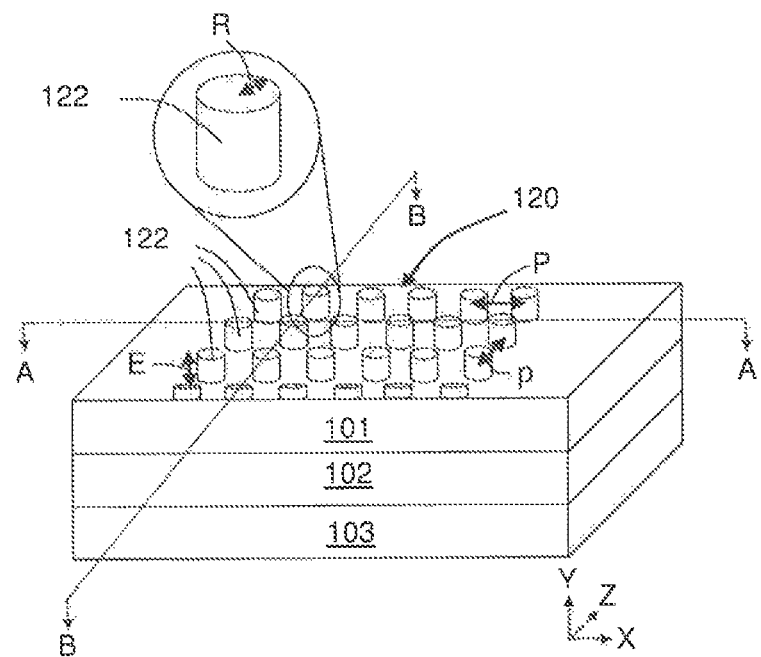
FIG. 5 shows a close-up perspective view of a two dimensional (2D) interrogating grating coupler of FIG. 1, according to an embodiment of the present invention.
Figure 6:
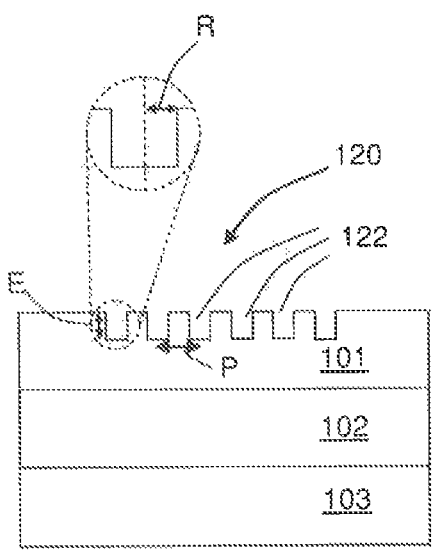
FIG. 6 shows a sectional view through section A-A of FIG. 5, according to an embodiment of the present invention.
Figure 7:
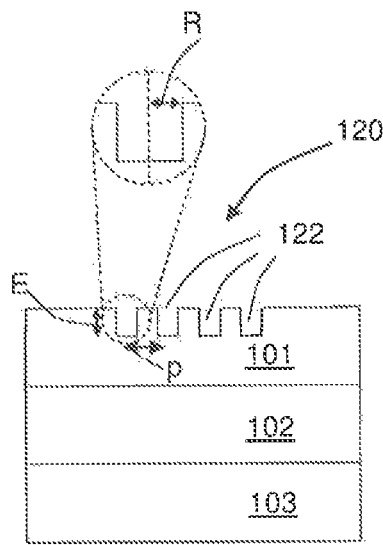
FIG. 7 shows a sectional view through section B-B of FIG. 5 according to an embodiment of the present invention.

FIG. 5 shows a close-up perspective view of the interrogating grating coupler 120 of FIG. 1, FIG. 6 shows a sectional view through section A-A of FIG. 5, and FIG. 7 shows a sectional view through section B-B of FIG. 5 according to an embodiment of the present invention. However it should be appreciated that the input grating coupler 115 and the output grating coupler 125 may be formed in a similar manner.

In some embodiments, the input grating coupler 115, the interrogating grating coupler 120 and the output grating coupler 125 are etched in a Silicon on Insulator (SOI) layer 101 using any suitable method known in the art. The SOI layer 101 may be made from silicon, or silicon nitride however it is not limited to such materials, but it should have a higher refractive index than the layer(s) above and the layer(s) below the SOI layer 101. The SOI layer 101 acts as a waveguide in order to optically couple the input grating coupler 115, the interrogating grating coupler 120 and the output grating coupler 125. In some embodiments, the SOI layer 101 is between 50 nm and 800 nm thick. More preferably, the SOI layer 101 is between 220 nm and 520 nm thick.

In some embodiments, the SOI layer 101 is formed on a Buried Oxide (BOX) layer 102, and the BOX layer 102 is formed on a substrate 103. The BOX layer 102 is made from a lower refractive index material than the SOI layer 101 in order that the SOI layer 101 functions as a waveguide. In some embodiments the BOX layer 102 is also made from silicon dioxide and about 100 nm to 2000 nm in thickness. However a person skilled in the art will realise that other suitable thicknesses may be used, as can other suitable materials.

In some embodiments, the sensor 100 may optionally include a Top Oxide (TOX) layer (not shown) formed on the SOI layer 101, once the holes 122 have been etched in the SOI layer 101. The TOX layer aids the reduction of interface losses and back reflections. The TOX layer may be between 100 nm and 2000 nm thick, and made from silicon dioxide. However it should be appreciated that other thicknesses and other materials may be used.

In addition, some embodiments may include a bottom reflector (not shown) positioned between the BOX layer 102 and the substrate 103 to improve the coupling efficiency of the input grating coupler 115, the interrogating grating coupler 120 and the output grating coupler 125 by reflecting light. However it should be appreciated that in some applications the bottom reflector is not necessary. For example in Atomic Force Microscopy applications, it might be beneficial to be able to visually see through the substrate. In some embodiments, the bottom reflector is limited to areas beneath the input grating coupler 115, the interrogating grating coupler 120 and the output grating coupler 125.

The bottom reflector may be made from Aluminium. However other high reflectance materials may be used. In addition, the bottom reflector may incorporate a dielectric mirror formed by alternating high and low refractive index layers and tuned to the wavelength of operation, for example silicon dioxide may be used for the low refractive index layer (~1.45 at 1550 nm) and silicon may be used as the high refractive index layer (~3.48 at 1550 nm) or silicon nitride may be used as the high refractive index layer (~1.9 at 1550 nm). In order to form a low loss waveguide in the SOI layer 102, the TOX layer and the BOX layer 102 should have a lower refractive index than the SOI layer 101 layer for a desired wavelength of operation.

Adjacent holes 122 in the array of holes have a pitch P in an X axis and a pitch p in a Z axis. In addition, each hole 122 has a radius R, and is etched to a depth E. Although the array is shown in FIG. 1 as being rectangular in shape, in some embodiments, the array may be square in shape. However it should be appreciated that the array may form any suitable regular or irregular shape. Further, each hole 122 has a same depth E, a same radius R, a same pitch p between adjacent holes 122, and a same pitch P between adjacent holes 122, creating a two dimensional (2D) grating coupler. However it should be appreciated that pitch p may be different to pitch P. It should also be appreciated that the radius R of the holes 122 may be different. Furthermore, it should be appreciated that the depth E of some of the holes, may be different.

Figure 8:
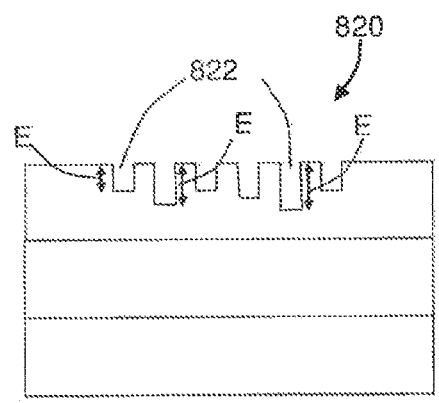
FIG. 8 shows a side sectional view of a further embodiment of a 2D interrogating grating coupler according to an embodiment of the present invention.

FIG. 8 shows a side sectional view of a further embodiment of a 2D interrogating grating coupler 820, for example a section along A-A of FIG. 1, according to an embodiment of the present invention. As shown in FIG. 8, some holes 822 of the interrogating grating coupler 820 are at different depths E.

Although each hole 122 in the array is shown in FIGS. 1, and 5-7 as being cylindrical, it should be appreciated that each hole 122 may be any suitable regular or irregular shape.

Parameters of the input grating coupler 115, the interrogating grating coupler 120 and the output grating coupler 125 are chosen according to a chosen wavelength of operation of light from the light source. The light may be at any suitable wavelength between infra-red wavelengths (about 700 nm to 1 mm) and ultra-violet wavelengths (about 100 nm to 380 nm), including visible wavelengths (about 380 nm to 700 nm).

In particular, parameters such as the SOI layer 101 thickness and material, the BOX layer 102 thickness and material, the pitch P, the pitch p, the radius R and the depth E may be tuned, for an wavelength of operation, by simulation. The process of tuning is described in more detail in a paper (Lee Carroll, Dario Gerace, Ilaria Cristiani, and Lucio C. Andreani, "Optimising polarization-diversity couplers for Si-photonics: reaching the −1 dB coupling efficiency threshold", Optical Society of America, Optics Express, Vol. 22, No. 12 (2014)) for tuning the coupling efficiency between a SOI and a fibre optic. The paper describes optimising a 2D grating coupler for coupling with fibre optic waveguides used for the telecoms industry. Thus the paper provides an example for a wavelength of operation at infra-red wavelengths. The effect of varying the parameters of a grating coupler may be investigated by computer simulation in order to optimise the grating coupler to best suit a radiation pattern from different sources, such as an optical fibre or a laser diode, or light output from the grating coupler.

Referring to section 3 of the paper, tuning the parameters of the 2D grating coupler of FIGS. 1 and 5-7, may be performed using a three-dimensional finite-difference time-domain (3D-FDTD) simulation on the 2D grating coupler by experimenting with the parameters of the 2D grating coupler. However a 3D-FDTD simulation can take 1000 times longer to run than a two-dimensional finite-difference time-domain (2D-FDTD) simulation. As such a one-dimensional (1D) grating coupler is first optimised using a 2D-FDTD simulation, and some optimised parameters are used to perform the 3D-FDTD simulations of the 2D grating coupler. An exemplary 1D grating coupler is shown in FIG. 9 and is also described in Australian Patent Application number 2011200815.

Referring again to section 3 of the paper, the 2D-FDTD simulations performed on a 1D grating coupler " . . . depend on the Si-layer [the SOI layer 101] thickness (S), the etch-depth (E) [depth E], the BOX [the BOX layer 102] thickness (B), the hole-radius (R) [radius R], and the grating-pitch (P) [pitch P and/or pitch p] of the SOI-PDC [the 2D grating coupler] design [the input grating coupler 115, the interrogating grating coupler 1020 or the output grating coupler 125]. Imposing the boundary conditions of λP=1550 nm [the wavelength of operation], and θ=10° [an angle of incidence of the light on the input grating coupler 115, the interrogating grating coupler 120 or the output grating coupler 125], reduces the number of independent design parameters to four—(i) the Si-layer thickness [the SOI layer 101], (ii) the BOX [the BOX layer 102] thickness, (iii) the normalized etch-depth (E/S) [the depth E divided by the thickness of the SOI layer 101], and (iv) the normalized hole-size (R/P) [radius R divided by the pitch P or pitch p] . . . . The parameter-space around these starting values is explored by generating ≈25 unique SOI-PDC designs, each using the initial estimate of the Si-layer and BOX thickness, but spanned by different combinations of E/S and R/P values. The coupling efficiency of each design is calculated using 3D-FDTD, with the grating-pitch iteratively adjusted until λP of CET(φ=45°) converges to 1550±2 nm. A contour plot of CET(φ=45°) spanned by E/S and R/P can then be built-up, from which the optimum combination of E/S and R/P (for the initial estimates of Si-layer and BOX thickness) can be immediately identified. Next, a small sweep of the BOX thickness around the initial estimate is performed for the SOI-PDC designs with the optimum pair of E/S and R/P values. This identifies the optimized design parameters (E, R, P, and B) of the SOI-PDC with the initial estimate of the Si-layer thickness. When this procedure is repeated for different Si-layer thicknesses around the initial estimated value, i.e. when the design parameter of S is also allowed to vary, then the globally optimized set of all parameters can be identified.

"Each design has a unique combination of Si-layer thickness (from S=160 nm to 520 nm, in 19 steps) [the SOI layer 101], BOX [the BOX layer 102]–thickness (from B=1800 nm to 2100 nm, in 7 steps), etch-depth (from E=0.2×S to 0.8×S, in 7 steps), and duty-cycle [duty-cycle (DC) of a 1D grating structure which is a ratio between a width of a groove to a period of the grooves, as would be understood by a person skilled in the art] (from DC=0.2 to 0.8, in 7 steps). Each design is individually centred on λP=1550±2 nm [the wavelength of operation] by tuning the grating-pitch [pitch P and pitch p]. The hierarchy of the parameter sweep is S-B-E-DC, so while the duty-cycle changes for each design, the Si-layer thickness only changes every 343 designs (343=7×7×7), etc." The simulations of FIG. 3(a) identified the best performing structure has a SOI layer 101 thickness of 420 nm, a BOX layer 102 thickness of 1900 nm, an depth E of 252 nm, and DC=0.7) at an wavelength of operation of 1550 nm, Referring again to section 4.1 of the paper, "The design parameters of the best performing SOI 1D-GC [1D grating coupler] design . . . are used as the starting values for the optimization of the high performance SOI-PDC design. After following the procedure outlined in Section 3, the optimized SOI-PDC design parameters are identified as S=400 nm, B=1900 nm, E/S=291 nm/400 nm=0.73, and R/P=167 nm/584 nm=0.29. As shown in the contour plot of FIG. 3(b), this SOI-PDC design offers a coupling efficiency of −1.9 dB (65%), meaning that the performance gap with respect to the best SOI 1D-GC is just 0.5 dB. The coupling spectrum of this optimized SOI-PDC design is given in FIG. 2(b), and has a 1 dB bandwidth of 38 nm, which is adequate for multiplexed telecom applications. To establish if the performance gap can be closed for all Si-layer thicknesses, 3D-FDTD optimization was also carried-out for SOI-PDCs with S=220 nm, 320 nm, and 520 nm."

As a result, the paper found the optimal design of 2D grating coupler without a reflector at an wavelength of operation of 1550 nm to have a SOI layer 101 thickness of 400 nm, a depth E of 291 nm, a hole 122 radius R of 167 nm, a pitch P=pitch p of 584 nm, and a BOX layer 102 thickness of 1900 nm. However it should be appreciated that the dimensions of the structure will vary according to many variables including whether a BOX layer 102 is used, and the wavelength of operation of a light source.

As previously mentioned, a reflector may be positioned between the BOX layer 102 and the substrate 103 to improve the coupling efficiency of the input grating coupler 115, the interrogating grating coupler 120 and the output grating coupler 125, which generally improves the coupling efficiency by 1 dB. Referring to section 4.2 of the paper, "FIG. 4(a) shows the coupling efficiency of 4704 unique SOI 1D-GC designs with bottom-reflector, as calculated by 2D-FDTD simulations. Each design has a unique combination of Si-layer thickness (from S=150 nm to 290 nm, in 8 steps), BOX-thickness (from B=1550 nm to 2100 nm, in 12 steps), etch-depth (from E=0.2×S to 0.8×S, in 7 steps), and duty-cycle (from DC=0.2 to 0.8, in 7 steps). The range of the BOX thicknesses in this sweep spans 550 nm (≈1550 nm/2nOX) to ensure the identification of a condition for perfectly constructive interference. As was the case in Section 4.1, each 1D-GC design is individually tuned to λP=1550±2 nm, and the sweep hierarchy is S-B-E-D, so that the Si layer thickness changes only once every 588 designs (588=12×7×7). The sweep identifies the best-performing uniform SOI 1D-GC with bottom-reflector as having a coupling efficiency of −0.6 dB (87%) with S=170 nm, B=1600 nm (or 2150 nm), E=51 nm, DC=0.5, and P=694 nm. This is the highest reported calculated coupling-efficiency for a uniform SOI 1D-GC design with bottom-reflector. However, it is somewhat less than the reported coupling efficiency from calculations of apodized SOI 1D-GC designs with bottom-reflector (−0.45 dB=92%) [9]. Both of these calculations compare well with reports of measured coupling efficiencies of −0.62 dB (87%) from apodized SOI 1D-GCs with bottom-reflectors.

"Using the same optimization procedure as that outlined in the previous section [for the embodiment without a bottom reflector], the parameters for the optimized SOI-PDC design with bottom-reflector are identified as S=160 nm, B=2175 nm, E/S=80 nm/160 nm=0.5, and R/P=209 nm/696 nm=0.3. As shown in the contour plot of FIG. 4(b), this SOI-PDC design offers a coupling efficiency of −0.95 dB (80%). The coupling spectrum of this optimized SOI-PDC with bottom-reflector is given in FIG. 2(c), and has a 1 dB bandwidth of 42 nm."

As a result, the paper found the optimal design of a 2D grating coupler with a reflector at a wavelength of 1550 nm to have a SOI layer 101 thickness of 160 nm, a depth E of 80 nm, a hole 122 radius R of 209 nm, a pitch P=pitch p of 696 nm, and a BOX layer 102 thickness of 2175 nm. However it should be appreciated that the dimensions of the structure will vary according to many parameters including whether a BOX layer 102 is used, and the wavelength of operation of a light source.

Referring back to FIG. 1, in use, a light source (not shown) is connected to the input grating coupler 115 using a waveguide or optical fibre for example. Similarly, the output grating coupler 125 is connected to an analyser (not shown), via a waveguide or optical fibre for example, for analysing light output from the grating coupled resonating structure 110. The light output from the grating coupled resonating structure 110 may be analysed in real time or recorded by the analyser or a computer for example, for analysis at a later time. Although the light is shown as being coupled via the input grating coupler 115 it should be appreciated that the light may be coupled using any suitable method. Similarly, although the light is shown as being output via the output grating coupler 125, it should be appreciated that the light may be coupled to the analyser via any suitable method.

In some embodiments, a reflective surface, similar to the reflective surface 107, may be placed above the input grating coupler 115 and above the output grating coupler 125. In this embodiment, light is coupled into the sensor 100 from under the input grating coupler 115 and light is coupled out of the sensor 100 from under the output grating coupler 125. In this case the substrate 103 is substantially transparent to the wavelength of operation to allow light to penetrate through the substrate 103 and the BOX layer 102 and into the SOI layer 101. In another embodiment, there may be no output grating coupler 125, and light may be coupled to a photodetector coupled directly to the SOI layer 101.

Solid arrows 104 illustrate a path of light through the optical cantilever sensor 100. The optical pulse and/or the interrogating light is input to the input grating coupler 105. The optical pulse and/or the interrogating light then propagates in the SOI layer 101, to the interrogating grating coupler 120. Light exits the interrogating grating coupler 120 in a near perpendicular direction towards the cantilever 105, and is reflected back by the cantilever 105 allowing the optical light and/or the interrogating light to resonate between the cantilever 105 and the interrogating grating coupler 120. The optical pulse creates an optical radiation pressure stimulating a movement of the cantilever 105. In addition the interrogating light modulated by the resonant cavity propagates along the grating coupled resonating structure 110 in the SOI layer 101 to the analyser via the output grating coupler 125. The analyser analyses an amplitude, a modulation and/or a frequency of the interrogating light coupled to the output grating coupler 125, which is a function of the distance between the interrogating grating coupler 120 and the cantilever 105, in order to determine a separation between the interrogating grating coupler 120 and the cantilever 105.

As explained previously a 1D grating coupler includes a series of grooves. The grooves are etched in a surface of the SOI layer 101 which results in a series of notches in a surface of the SOI layer when a section is taken through a single axis. The notches that result may be similar to FIG. 6.

In the case of a 2D grating coupler, a section taken in an X axis of FIG. 5 results in a series of notches in a surface of the SOI layer 101 as shown in FIG. 6. Similarly, a section taken in a Z axis of FIG. 6 results in a series of notches in a surface of the SOI layer 101 as shown in FIG. 7.

Although the grating coupled resonating structure 110 may be used with a single cantilever, it should be appreciated that the grating coupled resonating structure 110 may be used in arrays of cantilevers as discussed in Australian Patent Application number 2011200815.

In addition, although the invention has been described as stimulating, and measuring a deflection of, a cantilever, it should be appreciated that the present invention may be used to stimulate, and measure a deflection, of a beam, a membrane or any other suitable MicroElectroMechanical Systems (MEMS) structure.

In some embodiments, the cantilever 105 may include an analyte selective coating applied to all or part of a surface of the cantilever 105. For example the sensor 100 may be used to detect illicit drugs used in drug detection apparatus. In this embodiment, when an analyte is adsorbed by the cantilever, a mass of the cantilever changes, which changes a frequency of the interrogating light.

An advantage of the present invention is that the same structure may be used to stimulate movement of the cantilever and to measure an amount of movement of the cantilever. In some embodiments, a same light source may be used to generate the optical pulse to stimulate movement in the cantilever, and to generate the interrogating light which is used to measure a movement of the cantilever, which results in a more compact sensor, and a sensor that does not require additional apparatus to stimulate movement of the cantilever, and can be used in many applications requiring measurements of static or dynamic nanometer and subnanometer movements in air, vacuum or liquids.

The above description of various embodiments of the present invention is provided for purposes of description to one of ordinary skill in the related art. It is not intended to be exhaustive or to limit the invention to a single disclosed embodiment. As mentioned above, numerous alternatives and variations to the present invention will be apparent to those skilled in the art of the above teaching. Accordingly, while some alternative embodiments have been discussed specifically, other embodiments will be apparent or relatively easily developed by those of ordinary skill in the art. Accordingly, this patent specification is intended to embrace all alternatives, modifications and variations of the present invention that have been discussed herein, and other embodiments that fall within the spirit and scope of the above described invention.

We claim:

1. A method of stimulating a MicroElectroMechanical Systems (MEMS) structure, the method including the steps of:
   inputting an optical pulse into an input grating coupler;
   coupling the optical pulse via a waveguide into an interrogating grating coupler the interrogating grating coupler being arranged to form a resonant cavity with the MEMS structure;
   creating optical radiation pressure within the cavity from the optical pulse;
   stimulating a movement of the MEMS structure with the optical radiation pressure; and
   outputting the optical pulse from an output grating coupler.

2. The method of claim 1, wherein the step of stimulating a movement of the MEMS structure with the optical radiation pressure includes stimulating a movement of the MEMS structure primarily with the optical radiation pressure.

3. The method of claim 1, wherein the method further includes the step of inputting an interrogating light into the interrogating grating coupler after the optical pulse for measuring a deflection of the MEMS structure.

4. The method of claim 3, further including the step of resonating the interrogating light in the optical cavity between the MEMS structure and the interrogating grating coupler.

5. The method of claim 4, further including the step of outputting and analysing the interrogating light.

6. The method of claim 3, further including the step of adjusting an amplitude of a light source to produce both the interrogating light and the optical pulse.

7. The method of claim 1, further including the step of measuring static or dynamic nanometer and subnanometer movements in air, vacuum, or liquids.

8. The method of claim 1, wherein the MEMS structure has an analyte selective coating applied to all or part of its surface and the method further includes changing the mass of the MEMS structure by adsorbing analytes.

9. The method of claim 1, wherein the MEMS structure is a cantilever.

10. The method of claim 1, wherein the MEMS structure is a beam.

11. The method of claim 1, wherein the MEMS structure is a membrane.

12. The method of claim 1, further including the step of resonating the optical pulse within the resonant cavity and increasing a finesse of the optical cavity such that the optical radiation pressure increases and a greater force acts on the MEMS structure to move the MEMS structure.

13. The method of claim 1 wherein the MEMS structure and interrogating grating coupler form part of an optical sensor.

14. An optical sensor including:
   a MEMS structure;
   an input grating coupler for inputting the optical pulse into the optical sensor;
   an output grating coupler for outputting the optical pulse form the optical sensor; and
   an interrogating grating coupler positioned under the MEMS structure and a substrate; wherein
   the input grating coupler, the interrogating grating coupler and the output grating coupler are optically coupled using waveguides, and
   the MEMS structure and the interrogating grating coupler form a resonant cavity; and
   the MEMS structure and interrogating grating coupler are configured such that an optical pulse input to the interrogating grating coupler creates an optical radiation pressure that stimulates a movement of the MEMS structure.

15. The optical sensor of claim 14, wherein the MEMS structure is a cantilever.

16. The optical sensor of claim 14, wherein the MEMS structure is a beam.

17. The optical sensor of claim 14, wherein the MEMS structure is a membrane.

18. The optical sensor of claim 14, wherein the MEMS structure includes an analyte selective coating.

19. The optical sensor of claim 14, wherein the interrogating grating coupler is one dimensional.

20. The optical sensor of claim 14, wherein the interrogating grating coupler is two dimensional.

21. The optical sensor of claim 20, wherein the interrogating grating coupler includes an array of holes.

22. The optical sensor of claim 14, further including an analyser that analyses light output from the interrogating grating coupler.

* * * * *